(12) United States Patent
Tsuchiya et al.

(10) Patent No.: US 10,381,469 B2
(45) Date of Patent: Aug. 13, 2019

(54) SEMICONDUCTOR DEVICE AND METHOD OF MANUFACTURING THE SAME

(71) Applicant: DENSO CORPORATION, Kariya, Aichi-pref. (JP)

(72) Inventors: Yoshinori Tsuchiya, Kariya (JP); Shinichi Hoshi, Kariya (JP); Kazuyoshi Tomita, Nagakute (JP); Kenji Itoh, Nagakute (JP); Masahito Kodama, Nagakute (JP); Tsutomu Uesugi, Nagakute (JP)

(73) Assignee: DENSO CORPORATION, Kariya (JP)

( * ) Notice: Subject to any disclaimer, the term of this patent is extended or adjusted under 35 U.S.C. 154(b) by 287 days.

(21) Appl. No.: 15/101,156

(22) PCT Filed: Aug. 28, 2014

(86) PCT No.: PCT/JP2014/004423
§ 371 (c)(1),
(2) Date: Jun. 2, 2016

(87) PCT Pub. No.: WO2015/083304
PCT Pub. Date: Jun. 11, 2015

(65) Prior Publication Data
US 2016/0372587 A1    Dec. 22, 2016

(30) Foreign Application Priority Data
Dec. 6, 2013   (JP) .................. 2013-253365

(51) Int. Cl.
*H01L 29/778*   (2006.01)
*H01L 29/20*    (2006.01)
(Continued)

(52) U.S. Cl.
CPC .......... *H01L 29/778* (2013.01); *H01L 23/291* (2013.01); *H01L 23/3185* (2013.01);
(Continued)

(58) Field of Classification Search
None
See application file for complete search history.

(56) References Cited

U.S. PATENT DOCUMENTS 8,258,544 B2 * 9/2012 Nagahisa ............ H01L 29/7787
257/192
2006/0226415 A1   10/2006 Nishijima et al.
(Continued)

FOREIGN PATENT DOCUMENTS

JP    2006-066480 A    3/2006
JP    2006-173241 A    6/2006
(Continued)

*Primary Examiner* — Robert K Carpenter
(74) *Attorney, Agent, or Firm* — Posz Law Group, PLC

(57) ABSTRACT

A semiconductor device includes a switching device having: a substrate configured by a semi-insulating material or a semiconductor; a channel forming layer on the substrate that is configured by a compound semiconductor mainly having a group III nitride; a gate structure configured by a gate electrode on the channel forming layer with a gate insulating film interposed therebetween; and a source electrode and a drain electrode on the channel forming layer at both sides of the gate structure respectively, a collapse inhibiting layer on the channel forming layer in an element region of the channel forming layer where the switching device is arranged that is configured by an insulating material; and a leakage inhibiting layer on the channel forming layer in an element isolation region of the channel forming layer surrounding the element region that is configured by an insulating material different from that of the collapse inhibiting layer.

12 Claims, 6 Drawing Sheets

(51) Int. Cl.
    *H01L 29/06*         (2006.01)
    *H01L 29/417*      (2006.01)
    *H01L 29/04*         (2006.01)
    *H01L 29/66*         (2006.01)
    *H01L 23/29*         (2006.01)
    *H01L 23/31*         (2006.01)

(52) U.S. Cl.
    CPC ........ *H01L 29/045* (2013.01); *H01L 29/0649* (2013.01); *H01L 29/66462* (2013.01); *H01L 29/7787* (2013.01); *H01L 29/2003* (2013.01); *H01L 29/41766* (2013.01)

(56) References Cited

U.S. PATENT DOCUMENTS

| | | |
|---|---|---|
| 2009/0166678 A1 | 7/2009 | Sato et al. |
| 2010/0012977 A1 | 10/2010 | Derluyn et al. |
| 2013/0099324 A1* | 4/2013 | Huang .............. H01L 29/66522 |
| | | 257/401 |
| 2014/0273482 A1 | 9/2014 | Tsuchiya et al. |

FOREIGN PATENT DOCUMENTS

| | | |
|---|---|---|
| JP | 2008-235740 A | 10/2008 |
| JP | 2012-049216 A | 3/2012 |

\* cited by examiner

SEMICONDUCTOR DEVICE AND METHOD OF MANUFACTURING THE SAME

CROSS REFERENCE TO RELATED APPLICATION

This application is a U.S. national stage of International Application No. PCT/JP2014/004423 filed on Aug. 28, 2014 and is based on Japanese Patent Application No. 2013-253365 filed on Dec. 6, 2013, the disclosures of which are incorporated herein by reference.

TECHNICAL FIELD

The present disclosure relates to a semiconductor device including a switching device that includes a compound semiconductor having a nitride containing a Group 13 element such as Ga (gallium), Al (aluminum), and In (indium) as a principal component and a method of manufacturing the semiconductor device. The present disclosure is suitable for a semiconductor device that includes a switching device exemplified by a lateral HEMT, which is one type of GaN-HEMT (high electron mobility transistor) devices.

BACKGROUND ART

A conventional method is disclosed in Patent Literature 1 to facilitate formation of an insulating structure between devices to be formed on a Group-13 element nitride semiconductor layer. Specifically, ions are implanted into a Group-13 element nitride semiconductor layer in an area surrounding an element region (hereinafter referred to as an element isolation region) to form a modified region therein. An oxidation reaction is promoted in the modified region during an oxidation treatment. This facilitates formation of an insulating oxide film in the element isolation region, thereby making an insulating structure between devices with ease. Although such a method facilitates the formation of an insulating oxide film in the element isolation region, it also causes an insulating oxide film to be formed partially in the element region due to thermal oxidation. This results in increased surface unevenness. There is a difficulty in that it causes a reduction in mobility, which leads to degradation in performance of a switching device to be formed in the element region.

In another configuration in which devices are formed using a GaN layer and an AlGaN layer formed over a buffer layer provided on a substrate, a trench isolation structure is formed between the devices. The trench isolation structure extends from the surface of the AlGaN layer to the substrate or to a position near the substrate. This requires a deeply etched trench, which results in an increase in manufacturing process time and thereby an increase in manufacturing cost. This also necessitates a thick resist film or a metal mask as a mask material for use during the etching to allow for a deep trench, posing difficulty in achieving high integration in a semiconductor device.

As a solution to the difficulty described above, an insulating film is formed in an element isolation region using deposition. In the case of forming an insulating film using deposition, a semiconductor device is manufactured in a process, for example, as described below.

An AlGaN layer is formed on a GaN layer. Then, an element isolation region, which is an area surrounding an element region, is lowered to a height below the element region to provide a mesa structure. A silicon oxide film is then deposited on the surfaces of the element region and the element isolation region to provide an insulating film. Subsequently, an opening is formed, using a desired mask, in the silicon oxide film at a position where a gate electrode is to be placed. The opening extends through the silicon oxide film to the AlGaN layer to form a recessed part. A gate electrode is placed over a gate insulating film in the recessed part. Further openings are formed, using a desired mask, in the silicon oxide film at positions where a source electrode and a drain electrode are to be placed, that is, on opposing sides of the gate electrode. The openings extend through the silicon oxide film to the AlGaN layer to form recessed parts. The source electrode and the drain electrode are then placed in the recessed parts. A semiconductor device having an insulating film formed using deposition in an element isolation region is manufactured in this manner. A silicon nitride film, in place of a silicon oxide film, may be employed as an insulating film to be formed on the surfaces of the element region and the element isolation region.

PRIOR ART LITERATURES

Patent Literature

Patent Literature 1: JP-2006-66480-A

SUMMARY OF INVENTION

The use of deposition for forming an insulating film on the surfaces of the element region and the element isolation region can resolve the problem resulting from thermal oxidation, that is, increased surface unevenness due to the insulating oxide film formed partially in the element region.

It has been affirmed that, although the use of a silicon oxide film as an insulating film prevents a leak between devices effectively, it is not sufficiently effective against a current collapse. It has been also affirmed that, although the use of a silicon nitride film as an insulating film is effective against a current collapse, it does not produce a sufficient effect of preventing a leak between devices.

A current collapse refers to a significant reduction in drain current due to prolonged recovery of the amount of the drain current, which is caused by an increase in electric resistance associated with the switching operation of a switching device.

An object of the present disclosure is to provide a semiconductor device capable of preventing a leak between devices and effective against a current collapse, and a method of manufacturing the semiconductor device.

A semiconductor device in the present disclosure includes a switching device having: a substrate that is configured by a semi-insulating material or a semiconductor; a channel forming layer that is arranged on the substrate, and that is configured by a compound semiconductor having a group III nitride as a main component; a gate structure that is configured by a gate electrode through a gate insulating film on the channel forming layer; and a source electrode and a drain electrode that are arranged on the channel forming layer, and that are arranged at both sides of the gate structure respectively. In addition, the semiconductor device includes: a collapse inhibiting layer that is arranged on the channel forming layer in an element region of the channel forming layer where the switching device is arranged, and that is configured by an insulating material; and a leakage inhibiting layer that is arranged on the channel forming layer in an element isolation region of the channel forming layer surrounding the element region, and that is configured by an insulating material different from the insulating material of the collapse inhibiting layer.

As described above, the present disclosure includes both of the collapse inhibiting layer and the leakage inhibiting layer, which are made with mutually different materials. Hence, the semiconductor device is capable of preventing a leak between devices and effective against a current collapse.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Some embodiments of the present disclosure will now be described with reference to the drawings. Components identical or equivalent in the following embodiments are designated with identical symbols for description.

First Embodiment

Figure 1:
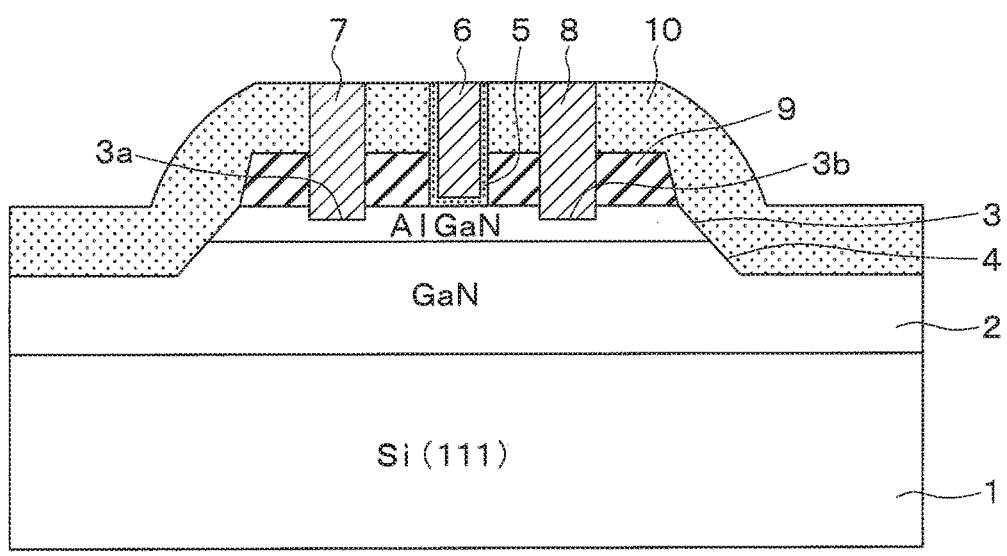
FIG. 1 is a sectional view of a semiconductor device including a lateral HEMT according to a first embodiment of the present disclosure.

A first embodiment of the present disclosure will now be described below. As illustrated in FIG. 1, a semiconductor device according to the present embodiment includes a lateral HEMT, which is a switching device including a compound semiconductor having a nitride containing a Group 13 element as a principal component. The HEMT has a structure as described below.

The lateral HEMT includes a compound semiconductor substrate on a surface of a substrate 1. The compound semiconductor substrate is a layered structure including a GaN layer 2 and an n-type AlGaN layer 3. A two-dimensional electron gas (hereinafter referred to as a 2DEG) carrier is induced in the compound semiconductor substrate at the AlGaN/GaN interface on the GaN layer side due to a piezoelectric effect and a polarization effect. This causes the lateral HEMT to operate.

The substrate 1 is made of a semi-insulating material or a semiconductor material, such as Si (111), SiC, and sapphire. The GaN layer 2 and the AlGaN layer 3 are formed over the substrate 1 using, for example, heteroepitaxial growth. The substrate 1 may have a resistivity value suitable for a characteristic of a target device. The resistivity value of the substrate 1 may be adjusted to any value in accordance with impurity concentration in the substrate 1. Additionally, an undepicted AlGaN—GaN superlattice layer or the like may be provided between the GaN layer 2 and the substrate 1 so that the GaN layer 2 has good crystallinity. Here, crystallinity refers to the presence of a defect and a dislocation in the GaN layer 2, which affect its electrical and optical properties.

The substrate 1 has an element region, in which a device is to be formed, and an element isolation region that surrounds the element region. A recessed part 4 is formed in the element isolation region to provide a mesa structure. The recessed part 4 has a depth extending from a surface of the AlGaN layer 3 and reaching the GaN layer 2. The recessed part 4 has a surface of a side wall inclined with respect to the surface of the substrate. For example, the AlGaN layer 3 has a thickness of approximately 20 nm, and the recessed part 4 has a depth equal to or greater than the thickness of the AlGaN layer 3.

Trenches 3a and 3b are formed in the surface of the AlGaN layer 3. A gate structure including a gate insulating film 5 and a gate electrode 6 formed on the gate insulating film 5 is provided in an area of the surface of the AlGaN layer 3 between the trenches 3a and 3b. The gate insulating film 5 is made of a material, such as an oxide film; the gate electrode 6 is made of a material, such as a metallic material or poly-Si doped with an impurity. Any optimally suited materials having any optimally suited structures may be selected as the materials of the gate electrode 6 and the gate insulating film 5 with consideration given to a threshold voltage, a gate withstand voltage, and a long term reliability of a target device. The gate insulating film 5 may be, for example, a Si oxide film or a Si nitride film, or may be made of a high dielectric constant material, such as SiON, $Al_2O_3$, and $La_2O_3$. The gate insulating film 5 may be a film made of these materials mixed or layered. In the case of the gate insulating film 5 formed of a high dielectric constant film, the gate insulating film 5 may be doped with nitrogen or Si by high-temperature heat treatment or plasma processing to curb the formation of a polycrystal.

A source electrode 7 is provided in an area of the surface of the AlGaN layer 3 in which the trench 3a is placed, such that the source electrode 7 is located in the trench 3a. A drain electrode 8 is provided in an area of the surface of the AlGaN layer 3 in which the trench 3b is placed, such that the drain electrode 8 is located in the trench 3b. The source electrode 7 and the drain electrode 78 are each made of an electrode material such as Al. The source electrode 7 is in ohmic contact with a surface of the trench 3a; the drain electrode 8 is in ohmic contact with a surface of the trench 3b.

A collapse inhibiting layer 9 having a thickness of, for example, 50 nm, is formed so as to cover an area of the surface of the AlGaN layer 2 outside the gate structure, the source electrode 7, and the drain electrode 8 in the element region. The collapse inhibiting layer 9 is a protective film for inhibiting a current collapse. The collapse inhibiting layer 9 is made with an insulating material containing nitrogen or Al and exemplified by a silicon nitride film, a silicon oxynitride film, alumina ($Al_2O_3$), and aluminum silicate (AlSiO). Use of the collapse inhibiting layer 9 including such an insulating material can inhibit an increase in electric resistance associated with the switching operation of the switching device to be formed in the element region, thereby reduce time taken to recover the amount of a drain current, and thus minimize the reduction in drain current. The collapse inhibiting layer 9 needs to have a thickness at least sufficient to form a continuous film. A discontinuous film causes a collapse in its interrupted area. The collapse inhibiting layer 9 typically needs to have a thickness of not less than 1 nm. If the thickness can be controlled with good controllability by a method such as ALD (atomic layer deposition), one or more of the collapse inhibiting layer 9 can produce a desired effect.

A leakage inhibiting layer 10 having a thickness of, for example, 100 nm is formed on a surface of the collapse inhibiting layer 9 and on surfaces of exposed areas of the GaN layer 2 and the AlGaN layer 3 in the recessed part 4. The leakage inhibiting layer 10 is a protective film for inhibiting a leak between devices. The leakage inhibiting layer 10 is made with an insulating material having a different property from the collapse inhibiting layer 9 and exemplified by a silicon oxide film and a material containing a Ga oxide as a principal component. In particular, the leakage inhibiting layer 10 is preferably formed with a material containing not less than 1% of oxygen, because it can O-terminate a localized defect in the surface of the GaN layer and thus effectively prevent a leak current through such defect. Use of the leakage inhibiting layer 10 including such an insulating material can insulate a device from an adjoining device, thereby prevent a leak between the devices. The thickness of the leakage inhibiting layer 10 needs to have a lower limit of not less than 1 nm, as in the case with the collapse inhibiting layer 9. If ALD is used, one or more of the leakage inhibiting layer 10 can produce a desired effect.

The lateral HEMT according to the embodiment has a configuration as described above. The lateral HEMT having such a configuration switches in is response to a gate voltage applied to the gate electrode 6. Specifically, the application of a gate voltage to the gate electrode 6 controls the concentration of an electron layer (an channel) of a 2DEG between the GaN layer 2 and the AlGaN layer 3 on the GaN layer side below the gate electrode 6, thereby applies a voltage between the source and the drain. In this manner, the lateral HEMT operates to cause a current to flow between the source and the drain.

The semiconductor device according to the embodiment includes both of the collapse inhibiting layer 9 and the leakage inhibiting layer 10, which are made with mutually different materials. Hence, the semiconductor device is capable of preventing a leak between devices and effective against a current collapse. Additionally, forming the collapse inhibiting layer 9 and the leakage inhibiting layer 10 produces effects of being able to reduce a parasitic capacitance of the device and cause the device to operate faster.

A method of manufacturing the semiconductor device including the lateral HEMT according to the embodiment will now be described with reference to FIGS. 2A to 2C.

Figure 2A:
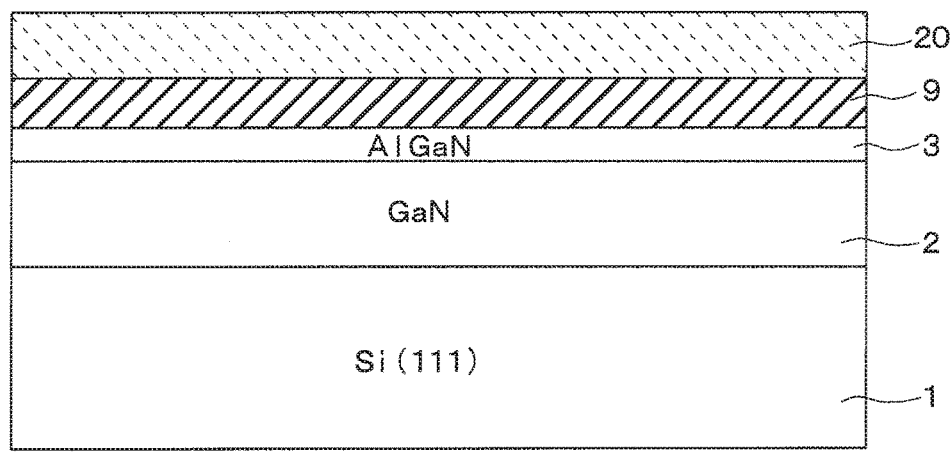
FIGS. 2A to 2C are sectional views illustrating manufacturing processes of the semiconductor device in FIG. 1.

[Process Illustrated in FIG. 2A]

A compound semiconductor substrate having a layered structure including the GaN layer 2 and the n-type AlGaN layer 3 is formed on the surface of the substrate 1 made of a material such as Si (111), SiC, and sapphire. For example, the GaN layer 2 and the AlGaN layer 3 are formed over the surface of the substrate 1 by a method such as MOCVD (metal organic chemical vapor deposition) and MBE (molecular beam epitaxy) with super high purity and high accuracy.

Then, the collapse inhibiting layer 9 made with an insulating material containing, for example, nitrogen or Al is formed on the surface of the AlGaN layer 3 by a method such as LPCVD (low pressure chemical vapor deposition). Subsequently, a resist film 20 is formed by a method such as spin coating and then patterned in a photolithograph process, such that the resist film 20 remains only in an area that is to be the element region.

Figure 2B:
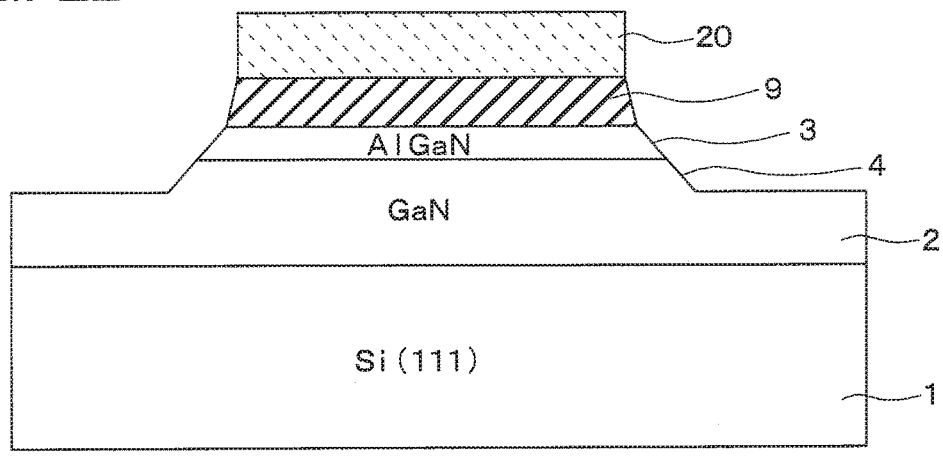

[Process Illustrated in FIG. 2B]

With the resist film 20 used as a mask, etching, such as RIE (reactive ion etching), is performed from the surface of the collapse inhibiting layer 9 to form the recessed part 4, such that the recessed part 4 has a depth extending through the AlGaN layer 3 to the GaN layer 2. The recessed part 4 is formed to provide the mesa structure. This forms the recessed part 4 in the AlGaN layer 3 and the GaN layer 2 and leaves the collapse inhibiting layer 9 on the AlGaN layer 3 that remains in the element region. Then, the resist film 20 is removed.

Figure 2C:
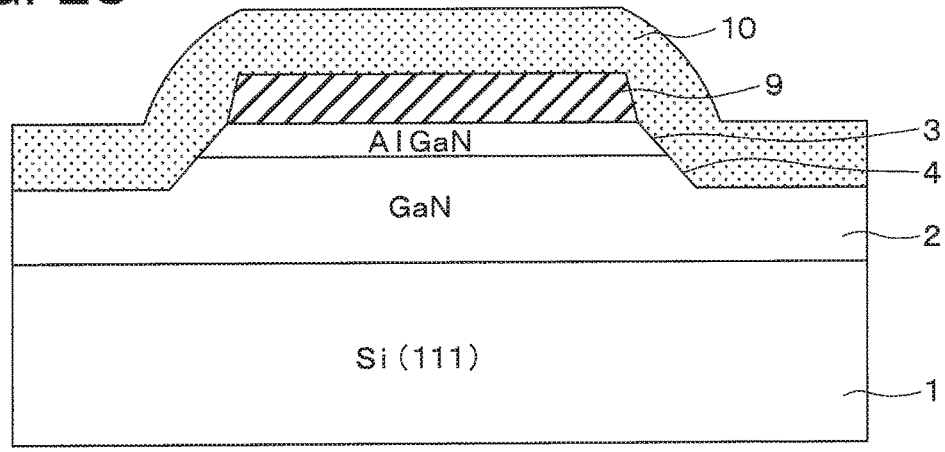

[Process Illustrated in FIG. 2C]

The leakage inhibiting layer 10 is formed on the surface of the collapse inhibiting layer 9 and the surfaces of the exposed areas of the GaN layer 2 and the AlGaN layer 3 in the recessed part 4 by a method such as LPCVD. The leakage inhibiting layer 10 is made with, for example, a silicon oxide film or a material containing a Ga oxide as a principal component.

Subsequent processes, which are undepicted and similar to conventional processes, may be exemplified by the following processes. A resist film is formed on the surface of the leakage inhibiting layer 10 and then patterned such that the resist film remains outside the area in which the gate structure is to be formed. Then, with the resist film used as a mask, unwanted portions of the leak inhibiting film 10 and the collapse inhibiting film 9 are removed to expose the AlGaN layer 3. With the resist film removed, the gate insulating film 5 is then formed so as to cover at least the exposed surface of the AlGaN layer 3. The gate electrode 6 is then formed on the gate insulating film 5. Another resist film is formed on the leakage inhibiting layer 10 and the gate structure and then is patterned such that the resist film remains outside the areas in which the source electrode 7 and the drain electrode 8 are to be formed. With this resist film used as a mask, unwanted portions of the leak inhibiting film 10 and the collapse inhibiting film 9, as well as some material of the AlGaN layer 3 are removed, such that the trenches 3a and 3b are formed therein. After the removal of the resist film, the source electrode 7 and the drain electrode 8 are formed in the trenches 3a and 3b. In this manner, the semiconductor device illustrated in FIG. 1 is completed.

As described above, this embodiment provides both of the collapse inhibiting layer 9 and the leakage inhibiting layer 10, which are made with mutually different materials. Hence, the semiconductor device is capable of preventing a leak between devices and effective against a current collapse.

Second Embodiment

A second embodiment of the present disclosure will now be described. This embodiment is similar to the first embodiment, except for a collapse inhibiting layer 9, which is modified. Since all other components are similar, differences from the first embodiment are described below.

Figure 3:
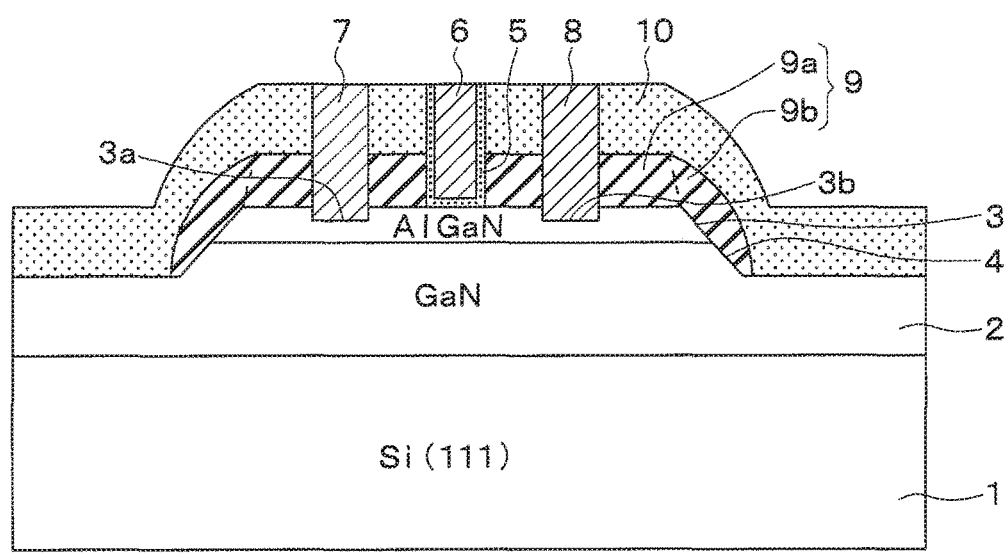
FIG. 3 is a sectional view of a semiconductor device including a lateral HEMT according to a second embodiment of the present disclosure.

As illustrated in FIG. 3, the collapse inhibiting layer 9 is formed so as to cover the surface of a side wall of a recessed part 4, which is formed to provide a mesa structure in the embodiment. The collapse inhibiting layer 9 has a surface portion 9a and a side wall portion 9b. The surface portion 9a is formed on an AlGaN layer 3; the side wall portion 9b covers a side surface of the surface portion 9a and the surface of the side wall of the recessed part 4.

The side wall portion 9b provided in addition to the surface portion 9a in this manner can inhibit a current collapse also at an edge of the element region, that is, at the surface of a side wall of the recessed part 4. Hence, the embodiment can produce the effects described in the first embodiment and also can inhibit a current collapse more effectively.

A method of manufacturing a semiconductor device including a lateral HEMT according to the embodiment will now be described with reference to FIGS. 4A to 4D.

Figure 4A:
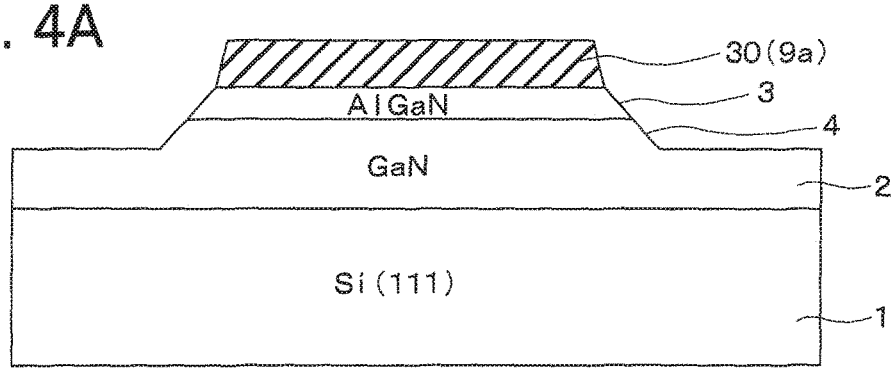
FIGS. 4A to 4D are sectional views illustrating manufacturing processes of the semiconductor device in FIG. 3.

[Process Illustrated in FIG. 4A]

The processes illustrated in FIGS. 2A and 2B, which have been described in the first embodiment, are performed. That is, a GaN layer 2, the AlGaN layer 3, and a surface forming film 30 for forming the surface portion 9a of the collapse inhibiting layer 9 are formed over a substrate 1. Then, unwanted portions of the surface forming film 30 and the AlGaN layer 3, as well as a surficial portion of the GaN layer 2 in an element isolation region are removed to form the recessed part 4.

Figure 4B:
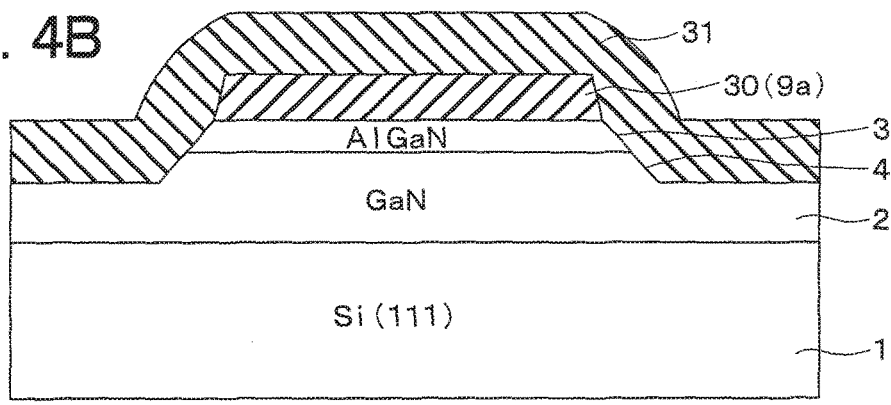

[Process Illustrated in FIG. 4B]

A side wall forming film 31 for forming the side wall portion 9b of the collapse inhibiting layer 9 is formed on a surface of the surface forming film 30 and the surfaces of the exposed areas of the GaN layer 2 and the AlGaN layer 3 in the recessed part 4. The side wall forming film 31 made with an insulating material containing, for example, nitrogen or Al may be formed by LPCVD.

The side wall forming film 31 is etched by anisotropic etching to form the side wall portion 9b so as to cover the side surface of the surface portion 9a and the surface of the side wall of the recessed part 4. This forms the collapse inhibiting layer 9, which covers an edge of the element region, that is, the surface of the side wall of the recessed part 4. The side wall portion 9b should be formed to cover an AlGaN/GaN interface exposed at the inclined portion of the mesa.

Figure 4C:
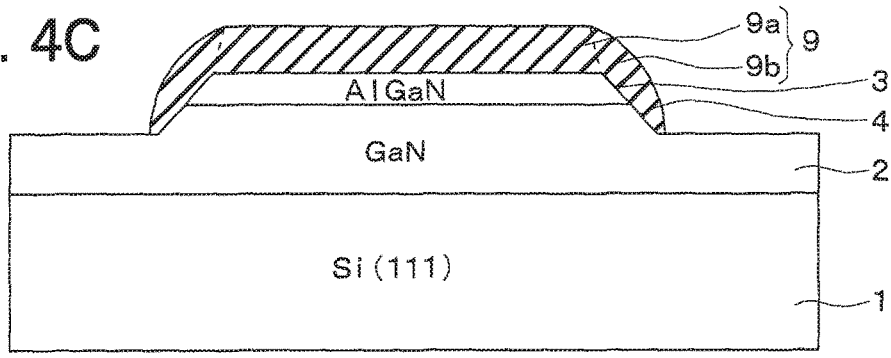
Figure 4D:
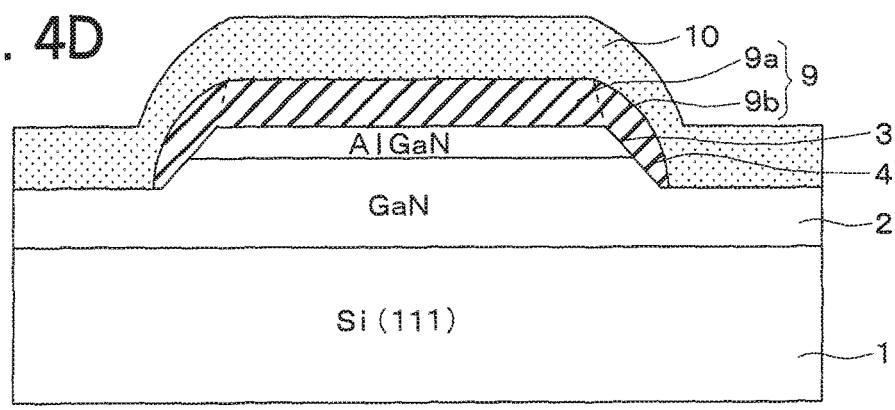

[Process Illustrated in FIG. 4D]

The process illustrated in FIG. 2C, which has been described in the first embodiment, is performed. This forms a leakage inhibiting layer 10 on a surface of the collapse inhibiting layer 9 and the surfaces of the exposed areas of the GaN layer 2 and the AlGaN layer 3 in the recessed part 4. The leakage inhibiting layer 10 is made with, for example, a silicon oxide film or a material containing a Ga oxide as a principal component.

A gate structure, a source electrode 7, and a drain electrode 8 are then formed by the methods described in the first embodiment. The semiconductor device according to the embodiment illustrated in FIG. 3 can be manufactured in this manner.

Third Embodiment

A third embodiment of the present disclosure will now be described. This embodiment is similar to the second embodiment, except for a leakage inhibiting layer 10, which is modified. Since all other components are similar, the parts different from the second embodiment are described below.

Figure 5:
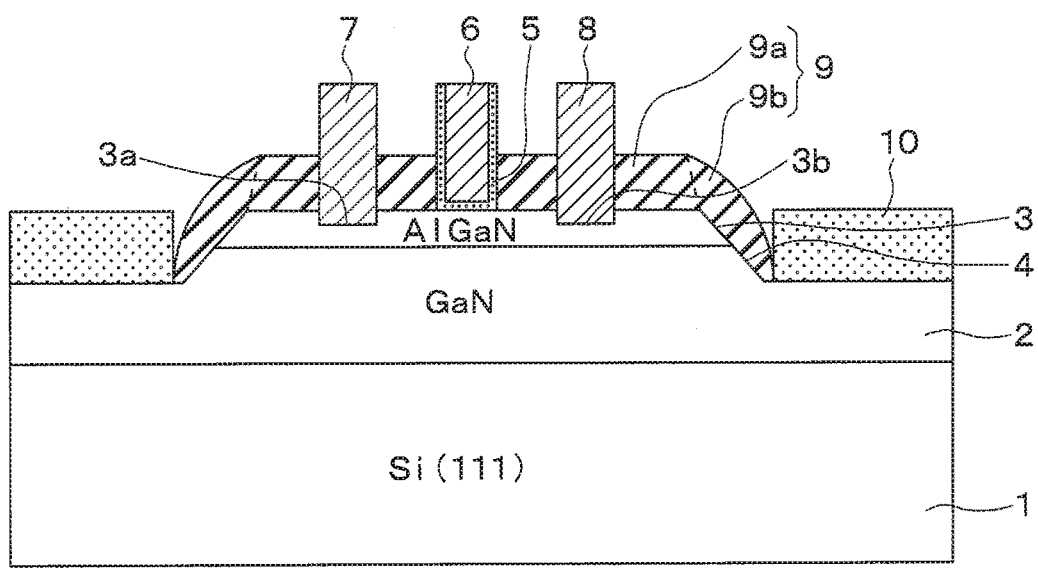
FIG. 5 is a sectional view of a semiconductor device including a lateral HEMT according to a third embodiment of the present disclosure.

As illustrated in FIG. 5, a collapse inhibiting layer 9 is also formed in this embodiment so as to cover the surface of a side wall of a recessed part 4 formed to provide a mesa structure, whereas the leakage inhibiting layer 10 is not formed on a surface of the collapse inhibiting layer 9. The leakage inhibiting layer 10 is formed only on the surface of the bottom of the recessed part 4 in the embodiment. That is, the leakage inhibiting layer 10 is provided only in an element isolation region.

Although the leakage inhibiting layer 10 is formed only in the element isolation region in this manner, a side wall portion 9b provided in addition to a surface portion 9a as in the case of the second embodiment can inhibit a current collapse also at an edge of an element region, that is, at the surface of a side wall of the recessed part 4. Hence, the embodiment can produce the effects described in the first embodiment and also can inhibit a current collapse more effectively, as in the case of the second embodiment.

A method of manufacturing a semiconductor device including a lateral HEMT according to the embodiment will now be described with reference to FIGS. 6A to 6D.

Figure 6A:
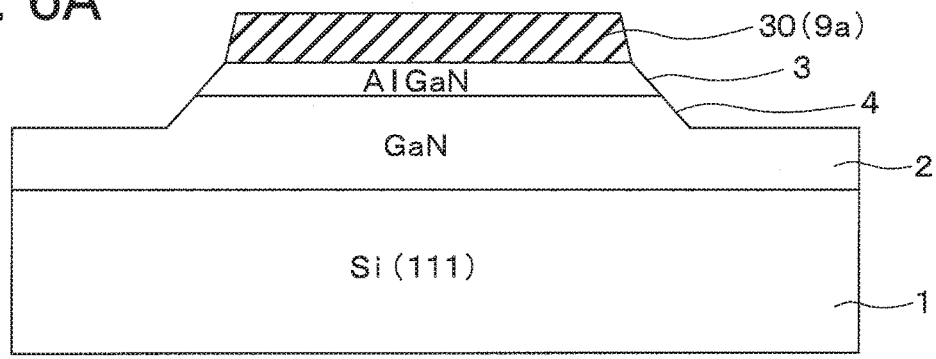
FIGS. 6A to 6D are sectional views illustrating manufacturing processes of the semiconductor device in FIG. 5.
Figure 6B:
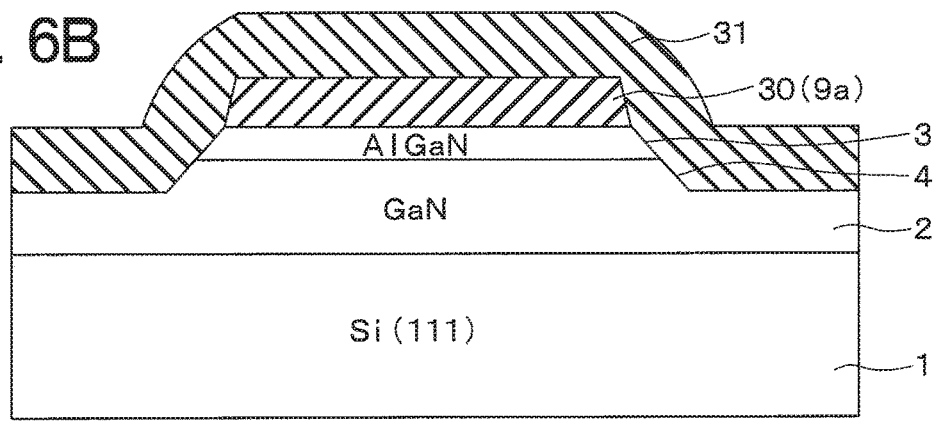
Figure 6C:
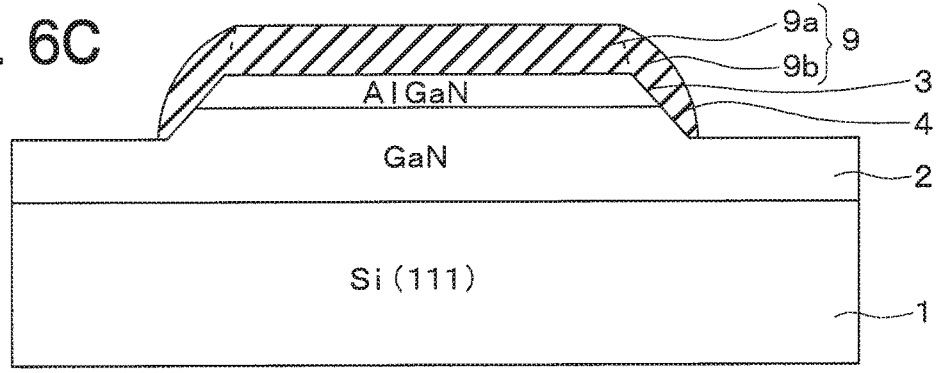
Figure 6D:
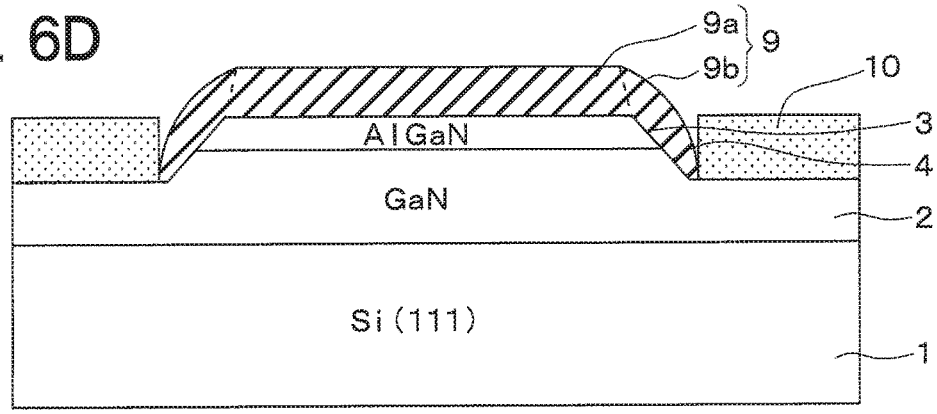

In processes illustrated in FIGS. 6A to 6C, processes similar to those illustrated in FIGS. 4A to 4C, which are described in the second embodiment, are performed. This forms the collapse inhibiting layer 9 including the side wall portion 9b, which covers the side surface of the surface portion 9a and the surface of the side wall of the recessed part 4. Then, in a process illustrated in FIG. 6D, an area of a GaN layer 2 exposed at the bottom of the recessed part 4 is thermally oxidized in a thermal oxidation process to form the leakage inhibiting layer 10 of a gallium oxide ($Ga_2O_2$). The element region is covered by the collapse inhibiting layer 9 at the stage of the oxidation process for the leakage inhibiting layer 10 in this embodiment; thus, no surface roughness associated with the oxidation treatment is caused in the device forming region. In this case, the collapse inhibiting layer 9 needs to have a thickness at least sufficient to prevent an AlGaN layer 3 in the element region from oxidizing during the oxidation process for the leakage inhibiting layer 10. Such a thickness is typically not less than 50 nm, though the thickness of the collapse inhibiting layer 9 may be adjusted with consideration given to conditions of the oxidation process.

The leakage inhibiting layer 10 formed in this manner is made of a film containing a thermal oxide of Ga as a principal component; thus, the leakage inhibiting layer 10 can reduce unbonded main concentration at the interface in comparison with a deposited film, thereby produce an effect of reducing a leak current component through the interface effectively. Additionally, the leakage inhibiting layer 10 can be provided only in the element isolation region, which eliminates the need for forming the leakage inhibiting layer 10 so as to cover a step in the mesa structure. This can lead to a reduction in thickness of the leakage inhibiting layer 10. Hence, the embodiment can improve a heat dissipation effect in comparison with the case of a thick leakage inhibiting layer 10, enabling a device to operate on a large current.

(Modification)

While the present disclosure has been described with reference to some embodiments, the present disclosure is not limited to these embodiments or structures described therein. The present disclosure includes various modifications and equivalent modifications. Additionally, various combinations and configurations, as well as other combinations and configurations including more, less, or only a single element, are within the scope and spirit of the present disclosure.

For example, the recessed part 4 formed to provide the mesa structure has a surface of a side wall inclined with respect to the surface of the substrate. This is to cause the side wall forming film 31 and the leakage inhibiting layer 10, which are formed in subsequent processes, to adhere to the surface of the side wall of the recessed part 4 with ease. The surface of the side wall of the recessed part 4 may be perpendicular to the surface of the substrate. Additionally, no mesa structure may be provided.

In addition to the use of the leakage inhibiting layer 10, which can provide isolation between devices, ions of an element that prevents a leak (for example, F [fluorine] and Fe [iron]) may be implanted into the surface of the GaN layer 2 in the element isolation region to prevent a leak more effectively.

Furthermore, the switching devices in the embodiments described above have a structure, which is exemplary and includes the GaN layer 2 and the AlGaN layer 3, provided on the substrate 1 to serve as a channel forming film. A switching device having another structure may be employed. For example, a switching device may have a structure including a substrate 1, a GaN layer 2 formed on the substrate 1, and a gate structure, a source electrode 7, and a drain electrode 8 that are formed on and in contact with the GaN layer 2. Alternatively, a switching device may include a channel forming layer including, for example, a GaN layer 2, and has a recess therein in which a gate structure is placed. An AlGaN layer 3 may be etched to remove a portion thereof in the recess completely or to remove it partially; one of these options, whichever is optimal, may be selected appropriately depending on a design for an operation threshold voltage of the device and a channel resistance.

The invention claimed is:

1. A semiconductor device comprising:
a switching device including:
   a substrate that is configured by a semi-insulating material or a semiconductor;
   a channel forming layer that is arranged on the substrate, and that is configured by a compound semiconductor having a group 13 nitride as a main component;
   a gate structure that is configured by a gate electrode on the channel forming layer with a gate insulating film interposed between the gate electrode and the channel forming layer; and
   a source electrode and a drain electrode that are arranged on the channel forming layer, and that are arranged at both sides of the gate structure respectively;
a collapse inhibiting layer that is arranged on the channel forming layer in an element region of the channel forming layer where the switching device is arranged, and that is configured by an insulating material having nitrogen or aluminum; and
a leakage inhibiting layer that is arranged on the channel forming layer in an element isolation region of the channel forming layer surrounding the element region, and that is configured by an insulating material different from the insulating material of the collapse inhibiting layer, wherein
in the element region of the channel forming layer, the collapse inhibiting layer is configured to cover a surface of the channel forming layer excluding a part of the surface where the gate structure is arranged or another part of the surface where the source electrode and the drain electrode are arranged,
the collapse inhibiting layer is disposed on both sides of the source electrode and both sides of the drain electrode, and
the collapse inhibiting layer is in contact with the gate insulating film.

2. The semiconductor device according to claim 1, wherein:
the leakage inhibiting layer includes the insulating material having at least 1% of oxygen.

3. The semiconductor device according to claim 1, wherein:
a recessed part is arranged in the element isolation region of the channel forming layer to configure a mesa structure; and
the leakage inhibiting layer is arranged at least on a bottom surface of the recessed part.

4. The semiconductor device according to claim 1, wherein:
the element region is configured by a layered structure in which the collapse inhibiting layer and the leakage inhibiting layer are stacked in order; and
the element isolation region is configured by a structure having only the leakage inhibiting layer.

5. The semiconductor device according to claim 3, wherein:
the collapse inhibiting layer includes: a surface portion that is arranged on a surface of the channel forming layer in the element region; and a side wall portion that is arranged on a surface of a side wall of the recessed part to configure the mesa structure;
the element region is configured by a layered structure in which the collapse inhibiting layer and the leakage inhibiting layer are stacked in order; and
the element isolation region is configured by a structure having only the leakage inhibiting layer.

6. The semiconductor device according to claim 3, wherein:
the collapse inhibiting layer includes: a surface portion that is arranged on a surface of the channel forming layer in the element region; and a side wall portion that is arranged on a surface of a side wall of the recessed part to configure the mesa structure;
the element region is configured by a structure having only the collapse inhibiting layer; and
the element isolation region is configured by a structure having only the leakage inhibiting layer.

7. The semiconductor device according to claim 1, wherein
the leakage inhibiting layer completely surrounds a top and two lateral sides of the element region, which extends between the drain electrode and the source electrode of the switching device.

8. The semiconductor device according to claim 1, wherein
the channel forming layer includes a mesa structure, which includes a plateau, an inclined side wall connected to the plateau, and a foundation connected to the inclined side wall of the mesa structure in the channel forming layer,
the collapse inhibiting layer includes a surface portion on the plateau of the channel forming layer and a side wall portion formed on the inclined side wall of the mesa structure in the channel forming layer, the side wall portion of the collapse inhibiting layer gradually curves along the inclined sidewall of the mesa structure ending at the foundation of the mesa structure,
the leakage inhibiting layer is formed only on the channel forming layer on the foundation of the mesa structure outside of the inclined sidewall, the leakage inhibiting layer is separated from a part of the sidewall layer of the collapse inhibiting layer by a wedge-shaped gap, and
the wedge-shaped gap has a first side that curves along the inclined sidewall of the collapse inhibiting layer and a second side opposite to the first side that extends perpendicular to an extension direction of the substrate layer.

9. A method of manufacturing the semiconductor device, comprising:
   forming a channel forming layer on a substrate;
   forming a surface portion of a collapse inhibiting layer by:
      forming a surface forming film on the channel forming layer,
      placing a mask on the surface forming film, and
      etching the surface forming film and the channel forming layer in the element isolation region using the mask to form a mesa structure that includes a recessed part in the channel forming layer and to form the surface portion of the collapse inhibiting layer;
   forming a sidewall portion of the collapse inhibiting layer by:
      forming a side wall forming film on the surface portion of the collapse inhibiting layer and the channel forming layer in the recessed part, and
      etching the side wall forming film by anisotropic etching so as to form the side wall portion of the collapse inhibiting layer and to expose the surface portion of the collapse inhibiting layer; and
   thermally oxidizing a surface of the channel forming layer in the recessed part so as to form a leakage inhibiting layer having an insulating material different from the insulating material of the collapse inhibiting layer.

10. The semiconductor device according to claim 1, wherein
   the element region is an area that extends between the drain electrode and the source electrode of the switching device.

11. The method of manufacturing according to claim 9, wherein
   in the forming of the leakage inhibiting layer, the leakage inhibiting layer is formed only on the channel forming layer outside of the mesa structure.

12. The method of manufacturing according to claim 11, wherein
   in the forming of the leakage inhibiting layer, a wedge-shaped gap is formed between the surface portion of the collapse inhibiting layer and the leakage inhibiting layer.

* * * * *